United States Patent
Enomoto

(10) Patent No.: US 7,300,877 B2
(45) Date of Patent: Nov. 27, 2007

(54) METHOD OF MANUFACTURING A SEMICONDUCTOR DEVICE

(75) Inventor: Takayuki Enomoto, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 324 days.

(21) Appl. No.: 11/033,869

(22) Filed: Jan. 13, 2005

(65) Prior Publication Data
US 2005/0153560 A1 Jul. 14, 2005

(30) Foreign Application Priority Data
Jan. 13, 2004 (JP) .............................. 2004-005033

(51) Int. Cl.
*H01L 21/302* (2006.01)
(52) U.S. Cl. .............................. 438/693; 257/E21.583; 438/692
(58) Field of Classification Search ................ 438/693, 438/692, 682; 257/E21.583; 451/57
See application file for complete search history.

(56) References Cited

U.S. PATENT DOCUMENTS

2002/0119662 A1* 8/2002 Kobayashi .................. 438/692
2004/0152316 A1* 8/2004 Ono et al. .................... 438/689
2005/0075056 A1* 4/2005 Wu et al. ....................... 451/57
2006/0246723 A1* 11/2006 Park et al. ................... 438/692

FOREIGN PATENT DOCUMENTS

| JP | 05-326469 | 12/1993 |
| JP | 2001-310256 | 11/2001 |
| JP | 2002-252279 | 9/2002 |

* cited by examiner

*Primary Examiner*—Caridad Everhart
(74) *Attorney, Agent, or Firm*—Young & Thompson

(57) ABSTRACT

A method of manufacturing a semiconductor device that prevents formation of scratches and occurrence of dishing in a CMP process. The method includes forming a first film on a part of a semiconductor substrate, forming a second film all over the semiconductor substrate, and a CMP process utilizing a ceria slurry to planarize the second film using the first film as a mask, the CMP process including performing a first CMP until a portion of the first film is exposed and performing a second CMP. A first ceria slurry of a predetermined abrasive grain concentration is employed in the first CMP, and a second ceria slurry of lower abrasive grain concentration is employed in the the second CMP. The number of scratches is reduced by reducing the abrasive grain concentration of the ceria slurry, and dishing is prevented by reducing a polishing rate ratio between the first and second films.

11 Claims, 9 Drawing Sheets

S1 FORMING SILICON NITRIDE FILM
S2 FORMING TRENCH

S3 FORMING SILICON DIOXIDE FILM

S4 FIRST CMP

S5 SECOND CMP

S6 REMOVE SILICON
NITRIDE FILM

FIG.4

| | POLISHING RATE OF OXIDE FILM | POLISHING RATE OF NITRIDE FILM | SELECTIVITY RATIO |
|---|---|---|---|
| FIRST CMP | 320 nm/min | 8 nm/min | 40 |
| SECOND CMP | 20 nm/min | 5 nm/min | 4 |

FIG.8

| | | MIXING RATIO (CERIA SOLUTION(2wt%)/ ADDITIVE SOLUTION(2wt%)/WATER) | SLURRY CONCENTRATION (wt%) | ADDITIVE (wt%) | RESULT | | |
|---|---|---|---|---|---|---|---|
| | | | | | DISHING (THE SMALLER THE BETTER) (nm) | LEVEL GAP AMONG PATTERNS (THE SMALLER THE BETTER) (nm) | NUMBER OF SCRATCHES (THE SMALLER THE BETTER) |
| FIRST CERIA SLURRY | a | 1/1/0 | 1 | 1 | 95.2 | 2.52 | 415 |
| SECOND CERIA SLURRY | b | 1/2/2 | 0.4 | 0.8 | 61.2 | 0.104 | 260 |
| | c | 1/2/3 | 0.33 | 0.76 | 60.4 | 0.256 | |
| | d | 1/3/3 | 0.285 | 0.857 | 55.4 | 0.325 | |
| | e | 1/4/3 | 0.25 | 1 | 62.1 | 0.722 | |
| | f | 1/4/4 | 0.22 | 0.889 | 46.3 | 0.884 | 106 |
| | g | 1/4/5 | 0.2 | 0.8 | 47.5 | | |
| | | 1/4/6 | 0.182 | 0.727 | 45.5 | 0.49 | 166 |

CERIA CONTAINING LIQUID:1 → REDUCED FROM 0.4 wt% TO 0.182wt%
ADDITIVE CONTAINING LIQUID:1 → ONLY CHANGED FROM 1wt% TO 0.72wt%    (NO SIGNIFICANT REDUCTION)

METHOD OF MANUFACTURING A SEMICONDUCTOR DEVICE

This application is based on Japanese patent application No. 2004-005033, the content of which is incorporated hereinto by reference.

BACKGROUND OF THE INVENTION

1. Field of the Invention

The present invention relates to a method of manufacturing a semiconductor device, and more particularly, to a method including a CMP (Chemical Mechanical Polishing) process performed for planarizing a surface of a semiconductor substrate.

2. Description of the Related Art

Achievement of a higher and higher integration level in semiconductor devices in these years has been promoting development of a multilayer interconnect structure composed of an increasing number of interconnect layers, to be provided on a semiconductor substrate. Along with such development, a problem of coverage performance of an interconnect layer formed as an upper interconnect layer has become apparent. In order to improve the coverage performance it is necessary to increase planarity of a surface of a semiconductor substrate or a lower interconnect layer, for which purpose a CMP process is popularly utilized, for chemically and mechanically polishing a surface of a semiconductor substrate or a lower interconnect layer with a slurry and a polishing pad. FIGS. 9A to 9D sequentially show a CMP process employed in formation of an isolation insulating film of an STI (shallow trench isolation) structure, including forming a shallow trench on a silicon substrate surface and filling the trench with an insulating material.

Firstly as shown in FIG. 9A, a pad oxide film 102 and a silicon nitride film 103 are formed on a surface of a silicon substrate 101, and a photoresist 104 is formed on the silicon nitride film 103, with an opening at a position corresponding to an isolation region.

Then an etching is performed to selectively remove the silicon nitride film 103 utilizing the photoresist 104 as a mask, after which an etching is again performed to remove a portion of the pad oxide film 102 utilizing the silicon nitride film 103 as a mask, and still an etching is performed on the silicon substrate 101, so as to form a trench (an isolation trench) 105 of a predetermined depth.

Referring to FIG. 9B, after forming a silicon dioxide film (thermally oxidized film) 106 on an inner face of the trench 105, a silicon dioxide film 107 is grown all over the silicon substrate 101 by an HPD-CVD (High-density Plasma CVD (Chemical Vapor Deposition)) process, up to a thickness greater than the depth of the trench 105, so that the trench 105 is filled.

Proceeding to FIG. 9C, a CMP process is performed to polish a surface of the silicon dioxide film 107 on the silicon substrate 101, until the silicon dioxide film 107 remains only inside the trench 105 and right thereabove.

Finally as shown in FIG. 9D, the silicon nitride film 103 is removed by etching, and a wet etching is performed on the surface of the pad oxide film 102 and the silicon dioxide film 107, such that the silicon dioxide film 107 remains only inside the trench 105. At this stage, an STI 110 which serves as an insulating structure for element isolation.

Such technique of planarizing a surface of a semiconductor device having an STI structure by a CMP process is disclosed in JP-A Laid Open No. 2002-252279.

Meanwhile, a silica slurry (SiO) has conventionally been employed in a CMP process to be performed in a case as above. However, in case of employing a silica slurry in a CMP process, such pattern dependence that a polishing rate becomes higher in a smaller area while the polishing rate becomes lower in a larger area is incurred according to the Preston Equation, which makes it difficult to achieve a desired planarity especially in a semiconductor device having a ultrafine pattern. Therefore, employing a ceria slurry (CeO) in a CMP process has recently been proposed, because thereby the problem of the pattern dependence can be minimized.

For example, JP-A Laid Open No. H05-326469 and JP-A Laid Open No. 2001-310256 are proposing to employ a ceria slurry in place of a silica slurry for achieving a higher planarity by a CMP process. A diameter of an abrasive grain of the conventional silica slurry is approximately 0.1 μm, and there is not much difference in the polishing rate between the silicon dioxide film and the silicon nitride film, which is expected to serve as a stopper. Accordingly, the silicon nitride film does not effectively perform as a stopper film, which makes it difficult to achieve a desired CMP effect on a fine pattern. In case of replacing the silica slurry with the ceria slurry described in JP-A Laid Open No. H05-326469 and JP-A Laid Open No. 2001-310256, the polishing rate ratio between the silicon dioxide film and the silicon nitride film may be increased, to thereby reduce the pattern dependence in comparison with the case employing the silica sulurry.

JP-A Laid Open No. 2001-310256 also proposes introducing an additive into the ceria slurry in addition to just employing the ceria slurry, and a surfactant such as a polycarboxylic acid polymer is cited as an example of the additive.

However, it has now been discovered that scratches (scratching during polishing process) are prone to be made on a surface of the silicon dioxide film polished by the abrasive grains during a CMP process since the ceria slurry includes large-diameter abrasive grains. Scratching in an initial stage of the polishing process is not so serious subject since the scratches fade away with the polishing progress. On the other hand, scratches formed shortly before finishing the polishing process remain as it is since there is little portion of the silicon dioxide film left to be polished.

Also, in the CMP process utilizing the ceria slurry, a polishing rate of the silicon dioxide film becomes faster than of the silicon nitride film. Accordingly, the polishing process advances faster especially in a region where the silicon dioxide film occupies a larger area, compared to a region where the silicon dioxide film occupies a smaller area. Therefore the region where the silicon dioxide film is predominant is polished in a recessed shape, thus resulting in a prominent occurrence of a dishing, a phenomenon that adversely the planarity is impaired. A reason that a polishing rate ratio of the silicon dioxide film to the silicon nitride film increases is as follows. While a surface potential of the silicon dioxide film becomes negative when being polished by the ceria slurry, the silicon nitride film tends to have 0 to a positive potential. Therefore the additive bearing a free negative charge in the ceria slurry adsorbs to a surface of the silicon nitride film, to thereby protect a surface of the silicon nitride film from being polished.

SUMMARY OF THE INVENTION

According to the present invention, there is provided a method of manufacturing a semiconductor device comprising forming a first film at least on apart of a semiconductor substrate; forming a second film all over the semiconductor substrate including the first film; and performing a CMP process employing a ceria slurry for planarizing the second film utilizing the first film as a stopper film; wherein the performing the CMP process includes performing a first CMP process until a portion of the first film is exposed and performing a second CMP process thereafter; the first CMP process includes utilizing a first ceria slurry of a predetermined abrasive grain concentration; and the second CMP process includes utilizing a second ceria slurry having a lower abrasive grain concentration than that of the first ceria slurry.

In the present invention, the abrasive grain concentration may be expressed in a weight ratio (weight percent (wt %)) of a weight of the abrasive grains against that of an entirety of the slurry.

According to the present invention, the first CMP process utilizing the ceria slurry can eliminate the pattern dependence so as to secure desired planarity on a semiconductor device having a fine pattern. In addition, a concentration of an abrasive grain in the ceria slurry, that is, a slurry concentration is lowered in the second CMP process, thereby preventing formation of scratches and thus reducing the number of scratches as a whole, and besides a polishing rate ratio with respect to the first and the second films is reduced, so as to inhibit a polishing progress in a region where the second film occupies a larger area, thus to prevent occurrence of a dishing. Consequently, while securing the advantage of minimizing the pattern dependence in a CMP process utilizing a ceria slurry, the problem of scratches or dishing, which often takes place in a CMP process utilizing a ceria slurry, can be supressed.

BRIEF DESCRIPTION OF THE DRAWINGS

The above and other objects, advantages and features of the present invention will be more apparent from the following description taken in conjunction with the accompanying drawings, in which:

FIG. 4 is a table showing polishing rates of the silicon dioxide film and the silicon nitride film and polishing rate ratios (selective ratios) therebetween, in a first and a second CMP process according to the example;

FIG. 8 is a cross-reference table showing an overall evaluation of the first CMP and the second CMP in which a second ceria slurry of a different concentration has been employed, according to the example.

DETAILED DESCRIPTION OF THE PREFERRED EMBODIMENTS

Figure 1:
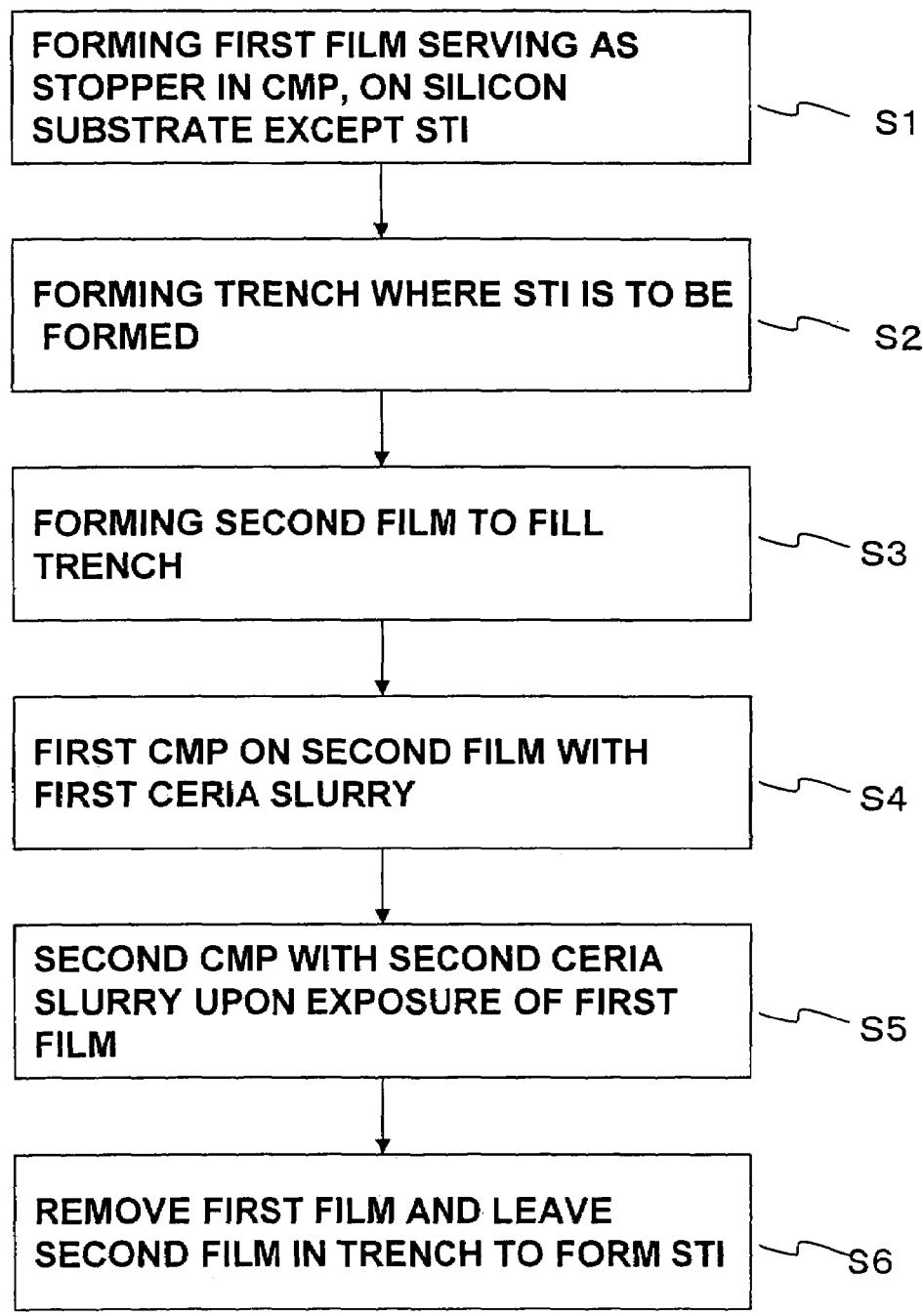
FIG. 1 is a flowchart describing a method of manufacturing a semiconductor device according to an example of the present invention.

The present invention will be now described herein with reference to illustrative embodiments. Those skilled in the art will recognize that many alternative embodiments can be accomplished using the teachings of the present invention and that the invention is not limited to the embodiments illustrated for explanatory purposed.

In the present invention, the first and the second ceria slurry may contain an additive constituted of a surfactant, and a concentration of the additive may be substantially the same between the first ceria slurry and the second ceria slurry. More specifically, the additive concentration of the second ceria slurry may be set to be approximately 70% or higher, with respect to the additive concentration of the first ceria slurry. Such arrangement more assuredly inhibits occurrence of a dishing, in a CMP process utilizing a ceria slurry.

By introducing such additive, the additive adsorbs around abrasive grains by hydrogen bonding, thereby inhibiting polishing progress by the abrasive grains. Here, in a protruding region of the silicon dioxide film to be polished, the additive that has adsorbed to the abrasive grains is desorbed because a higher pressure is applied by a polishing pad. By contrast, in a recessed region of the silicon dioxide film the additive remains adsorbed to the abrasive grains and hence a higher polishing rate is achieved in the protruding region than in the recessed region, which can result in attaining the more flat surface by the CMP process.

Also, the abrasive grain concentration of the second ceria slurry may be set to be 40% or lower, with respect to the abrasive grain concentration of the first ceria slurry. Such arrangement more effectively prevents formation of scratches, in a CMP process utilizing a ceria slurry. Here, a lower limit of the abrasive grain concentration of the second ceria slurry with respect to that of the first ceria slurry may be appropriately selected in accordance with a material and other factors of a film to be polished in the CMP process.

In a first embodiment of the present invention, the first and the second ceria slurry of a different abrasive grain concentration are prepared in advance for the first CMP process and the second CMP process respectively, and the first ceria slurry is replaced with the second ceria slurry at a transition from the first CMP process to the second CMP process.

In a second embodiment of the present invention, the second ceria slurry to be used in the second CMP process is prepared by adding a dispersion medium (solvent) to the first ceria slurry used in the first CMP process, so as to lower the abrasive grain concentration of the first ceria slurry. In the second embodiment, the additive may be introduced to a solvent to be added to the first ceria slurry and the diluted slurry is utilized as the second ceria slurry, so that substantially the same additive concentration as that of the first ceria slurry can be maintained.

Further in the first and the second embodiment of the present invention, a polishing rate ratio between the second film and the first film (a polishing rate of the second film/a polishing rate of the first film) in the second CMP process may be set smaller by an order of magnitude than a polishing rate ratio in the first CMP process. Such arrangement more effectively inhibits occurrence of a dishing.

EXAMPLE

Now referring to the accompanying drawings, the embodiments of the present invention will be described in further details. Hereafter, constituents employed in common in different drawings will be given an identical numeral, and description thereof may not be presented as the case may be.

FIG. 1 is a flowchart describing a basic method of manufacturing a semiconductor device according to this embodiment, wherein the method is applied to formation of a shallow trench isolation (STI) region in a semiconductor device.

The manufacturing process of the STI shown in FIG. 1 includes a step S1 of forming a first film which serves as a stopper film in a CMP process, in a region on a silicon substrate other than an STI forming region, a step S2 of forming a trench in the STI forming region, a step S3 of forming a second film so as to fill the trench, a first CMP step S4 of performing a CMP on the second film utilizing a first ceria slurry, a second CMP step S5 of performing a CMP utilizing a second ceria slurry, after the step S4 when a portion of the first film is exposed, and a step S6 of removing the first film and leaving the second film in the trench so as to form the STI.

Hereunder, the foregoing steps S1 to S6 will be described by turns referring to FIGS. 2A to 2C and 3A to 3C. FIG. 3C is a schematic cross-sectional view showing a constitution of the semiconductor device according to this example, and FIGS. 2A to 2C, and FIGS. 3A and 3B are schematic cross-sectional drawings sequentially showing the manufacturing process of the semiconductor device shown in FIG. 3C.

Figure 2A:
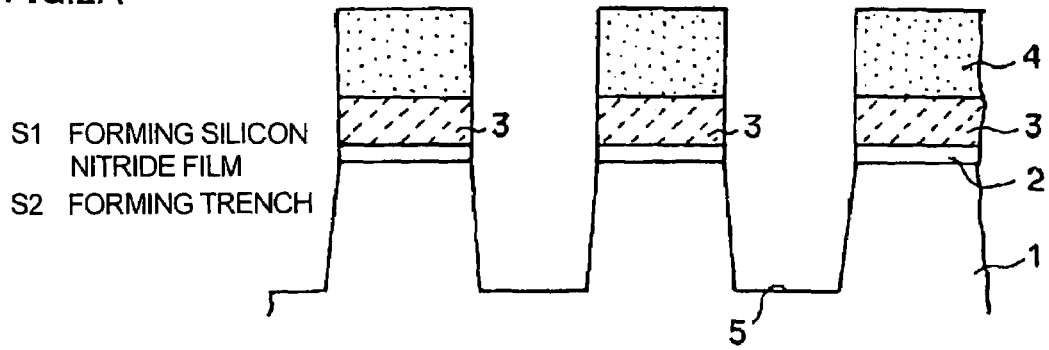
FIG. 2A is aschematic cross-sectional view showing a method of manufacturing the semiconductor device according to the example.

Firstly referring to FIG. 2A, the step S1 includes forming a first silicon dioxide film 2 of approximately 10 nm in thickness on a surface of a silicon substrate 1, and forming a silicon nitride film 3 of approximately 100 to 150 nm in thickness on the first silicon dioxide film 2. The silicon nitride film 3 is an example of the first film claimed in the present invention.

Also, a photoresist mask 4 is formed with an opening at a position corresponding to the STI forming region, and a plasma etching is performed utilizing the photoresist mask 4, so as to selectively remove a portion of the silicon nitride film 3 corresponding to the opening.

Then in the step S2, the silicon dioxide film 2 and the silicon substrate 1 are sequentially subjected to a plasma etching with the silicon nitride film 3 remaining and serving as a mask, so that a trench 5 is formed in the semiconductor substrate 1 in a depth of approximately 300 to 350 nm.

Figure 2B:
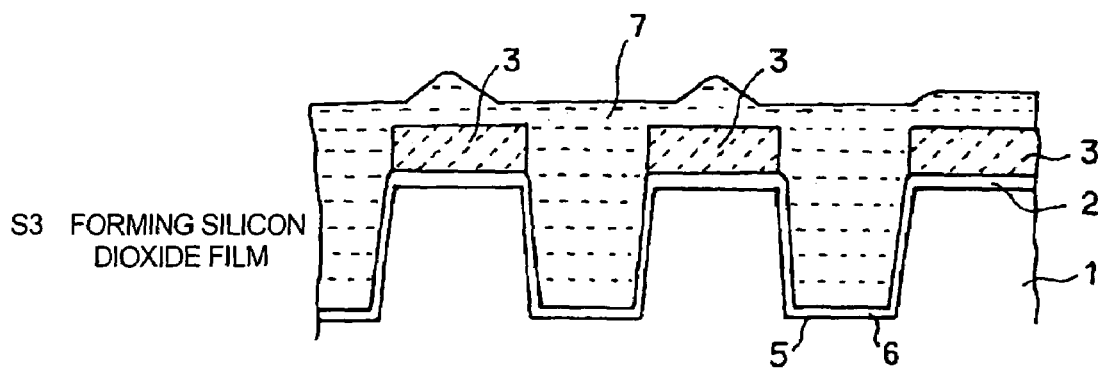
FIG. 2B is aschematic cross-sectional view showing a method of manufacturing the semiconductor device according to the example.

Referring to FIG. 2B, in the step S3 a silicon dioxide film (thermally oxidized film) 6 of approximately 10 nm in thickness, by thermal oxidation of the silicon substrate 1 exposed along an inner face of the trench 5. Thereafter, a second silicon dioxide film 7 is formed by an HDP-CVD process all over the silicon substrate 1.

The second silicon dioxide film 7 is an example of the second film claimed in the present invention. The second silicon dioxide film 7 is formed to be sufficiently thicker than the depth of the trench 5, for example in a total thickness of approximately 600 to 700 nm, so that a thickness of approximately 100 to 200 nm is still secured on a surface of the silicon nitride film 3, which is formed on a surface of the first silicon dioxide film 2.

Figure 2C:
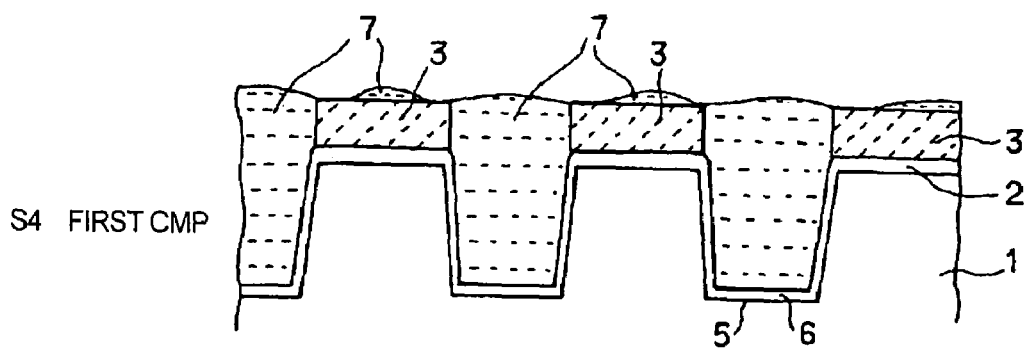
FIG. 2C is aschematic cross-sectional view showing a method of manufacturing the semiconductor device according to the example.

Then referring to FIG. 2C, in the step S4 the first CMP process is performed utilizing the first ceria slurry and a polishing pad, to polish an entire upper surface of the silicon substrate 1, that is, the surface of the second silicon dioxide film 7.

The first CMP process is performed until a portion of a surface of the silicon nitride film 3, which is the underlying film of the second silicon dioxide film 7, is exposed. This may be performed, for example, based on a CMP duration predetermined through a sample polishing of a silicon substrate on which the silicon dioxide film 7 is similarly formed, by measuring therein a polishing time before a portion of a surface of the silicon nitride film 3 is exposed.

Alternatively, an end point of the polishing can be detected by detecting a torque variation of a CMP apparatus due to the exposure of the silicon nitride film 3. The torque variation may be detected for example from a reduction of a driving current of the CMP apparatus associated with a polishing pressure in the CMP apparatus, caused when the silicon nitride film 3 is exposed.

Figure 3A:
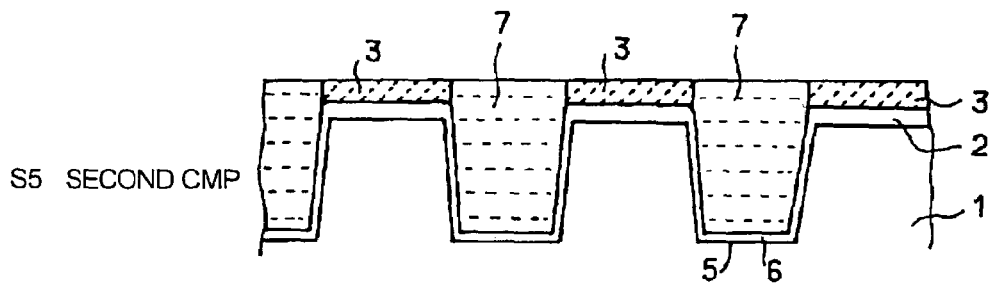
FIG. 3A is a schematic cross-sectional view showing a method of manufacturing the semiconductor device according to the example.

Proceeding to FIG. 3A, the second CMP process is performed utilizing the second ceria slurry in the step S5.

The second CMP process is performed until the second silicon dioxide film 7 is no longer left on a surface of the silicon nitride film 3, and an entire surface of the silicon substrate 1 including the silicon nitride film 3 and the second silicon dioxide film 7 becomes flat.

Figure 3B:
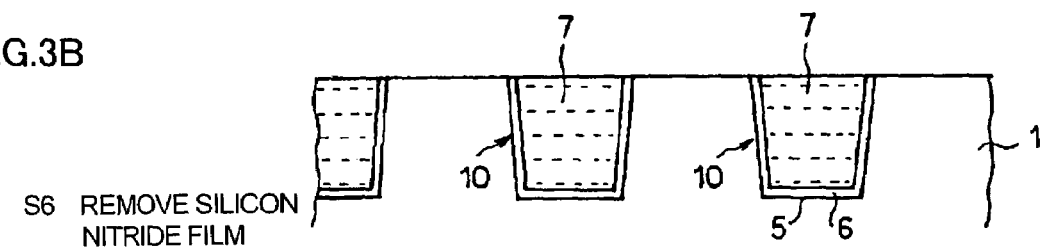
FIG. 3B is a schematic cross-sectional view showing a method of manufacturing the semiconductor device according to the example.
Figure 3C:
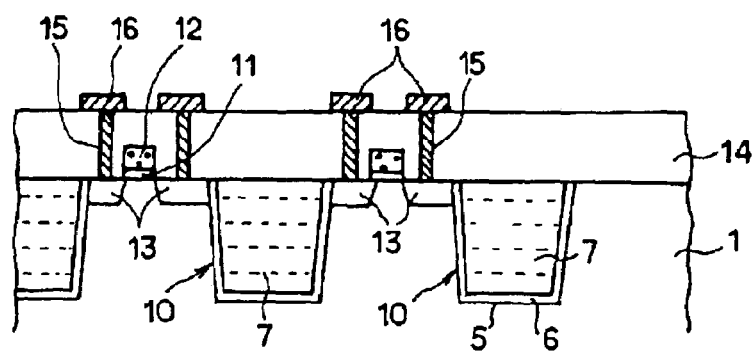
FIG. 3C is a schematic cross-sectional view showing a structure of the semiconductor device according to the example.

Then in the step S6, a wet etching is performed on a surface of the second silicon dioxide film 7, the silicon nitride film 3, and also the first silicon dioxide film 2 so as to expose a surface of the silicon substrate 1. As a result, the STI 10 is formed, such that the second silicon dioxide film 7 remains only inside the trench 5 maintaining its surface planarity, as shown in FIG. 3B.

Finally as shown in FIG. 3C, a predetermined element is formed in an element forming region on the silicon substrate 1 defined by the STI 10. For example, in the case where the element is a MOS transistor, a gate oxide film 11 and a gate electrode 12 are formed on a surface of the element forming region, and an impurity is selectively implanted in the silicon substrate 1 in the element forming region, so as to form a source/drain region 13. Further, an interlayer insulating film 14 is formed all over the silicon substrate 1. Then, a contact (conductive plug) 15 is formed so as to penetrate through the interlayer insulating film 14 and to be connected to the source/drain region 13, and a metal interconnect 16 is formed in contact with an upper end portion of the contact 15. Throughout the foregoing steps, the semiconductor device as shown in FIG. 3C is obtained.

Now, the first and the second ceria slurry employed the first and the second CMP process according to the foregoing steps S4 and S5 will be described.

The first and the second ceria slurry are the same in that the both are a mixture of abrasive grains of the ceria slurry (particles of cerium oxide); an additive constituted of a surfactant such as a polycarboxylic acid polymer, specifically polymer or copolymer having monomer units selected one or more from the group consisted of acrilic acid, methacrilic acid, their derivatives and their salts; and water (pure water) which is the dispersion medium (solvent). And the first ceria slurry utilized in the first CMP process is prepared in a predetermined abrasive grain concentration (hereinafter referred to as a "slurry concentration"), and the second ceria slurry utilized in the second CMP process is prepared in a lower slurry concentration than the first ceria slurry. Here, the slurry concentration will be expressed in a weight percent (wt %) of the abrasive grains against an entirety of the slurry.

For executing the first and the second CMP process utilizing the first and the second ceria slurry having different slurry concentrations, for example the following first and second method can be adopted.

The first method is separately preparing ceria slurries of different slurry concentrations, that is, the first ceria slurry of the predetermined slurry concentration and the second ceria slurry of a lower slurry concentration, and utilizing the first ceria slurry in the first CMP process, but replacing the first ceria slurry with the second ceria slurry in the second CMP process.

The second method is adding water which is the dispersion medium (solvent) to the first ceria slurry utilized in the first CMP process, so as to lower the slurry concentration and to continue to utilize the diluted slurry as the second ceria slurry in the second CMP process, without replacing the first ceria slurry.

Also, regarding the additive constituted of a surfactant such as a polycarboxylic acid polymer, contained in the first and the second ceria slurry, the additive concentration is set to be substantially the same between the first ceria slurry and the second ceria slurry. Here, the additive concentration will also be expressed by a weight percent (wt %) of the additive with respect to an entirety of the slurry. Also, in case of preparing the second ceria slurry in the second method, adding a predetermined amount of additive to the first ceria slurry together with water enables maintaining the same additive concentration as that of the first ceria slurry.

According to this example, the first CMP process is performed utilizing the first ceria slurry, and after a portion of a surface of the silicon nitride film 3, which serves as a stopper film, is exposed, the second CMP process is performed utilizing the second ceria slurry having a lower slurry concentration. Employing the second ceria slurry having a lower slurry concentration at a finishing stage of the second CMP process leads to reduction of a density of the number of abrasive grains with respect to an area to be polished on the silicon substrate 1. Therefore, a probability of formation of scratches is lowered, which naturally leads to prevention of formation of scratches.

Also, according to this embodiment, the slurry concentration of the second ceria slurry is also lowered. This suppresses a polishing rate both in the second silicon dioxide film 7 and in the silicon nitride film 3. However, since a polishing rate is lower from the beginning in the silicon nitride film 3, a reduction effect of the polishing rate can be made relatively higher in the second silicon dioxide film 7. Consequently, a ratio between the polishing rate of the second silicon dioxide film 7 and that of the silicon nitride film 3 can be reduced. Resultantly, an upper surface of the semiconductor device can be uniformly planarized at the finishing stage of the CMP process (FIG. 3A).

FIG. 4 is a table showing an investigation result on the polishing rates of a silicon dioxide film and of a silicon nitride film, and polishing rate ratios (selective ratios) therebetween, in the first and the second CMP process.

In the example shown in FIG. 4, a polishing rate ratio by the first ceria slurry between the silicon dioxide film and the silicon nitride film (also referred to as a "selective ratio": a polishing rate of the silicon dioxide film/a polishing rate of the silicon nitride film) is 40, while a polishing rate ratio by the second ceria slurry is reduced to as low as 4, which is smaller by an order in magnitude. With such reduction, a polishing progress is suppressed in a region where the silicon dioxide film occupies a larger area, and hence a difference from a region where the silicon dioxide film occupies a smaller area is reduced. Consequently, a dishing, which is a phenomenon that a region including a larger silicon dioxide film area is polished in a recessed shape, can be supressed.

In view of the results shown in FIG. 4, it is understood that setting a polishing rate ratio by the second ceria slurry between the silicon dioxide film and the silicon nitride film, in other words the polishing rate ratio between the second film and the first film (a polishing rate of the second film/a polishing rate of the first film) according to the present invention, to be smaller by an order of magnitude than the first ceria slurry, results in supressing the dishing still more effectively.

Also, though the second ceria slurry has a lower slurry concentration, an additive concentration of not less than a predetermined value is secured. Therefore, the additive equally continues to serve for increasing the polishing rate in a protruding portion with respect to a recessed region of the silicon dioxide film to be polished. Consequently, a uniformly flat polishing result can be obtained, without incurring the problem of the pattern dependence.

Figure 5:
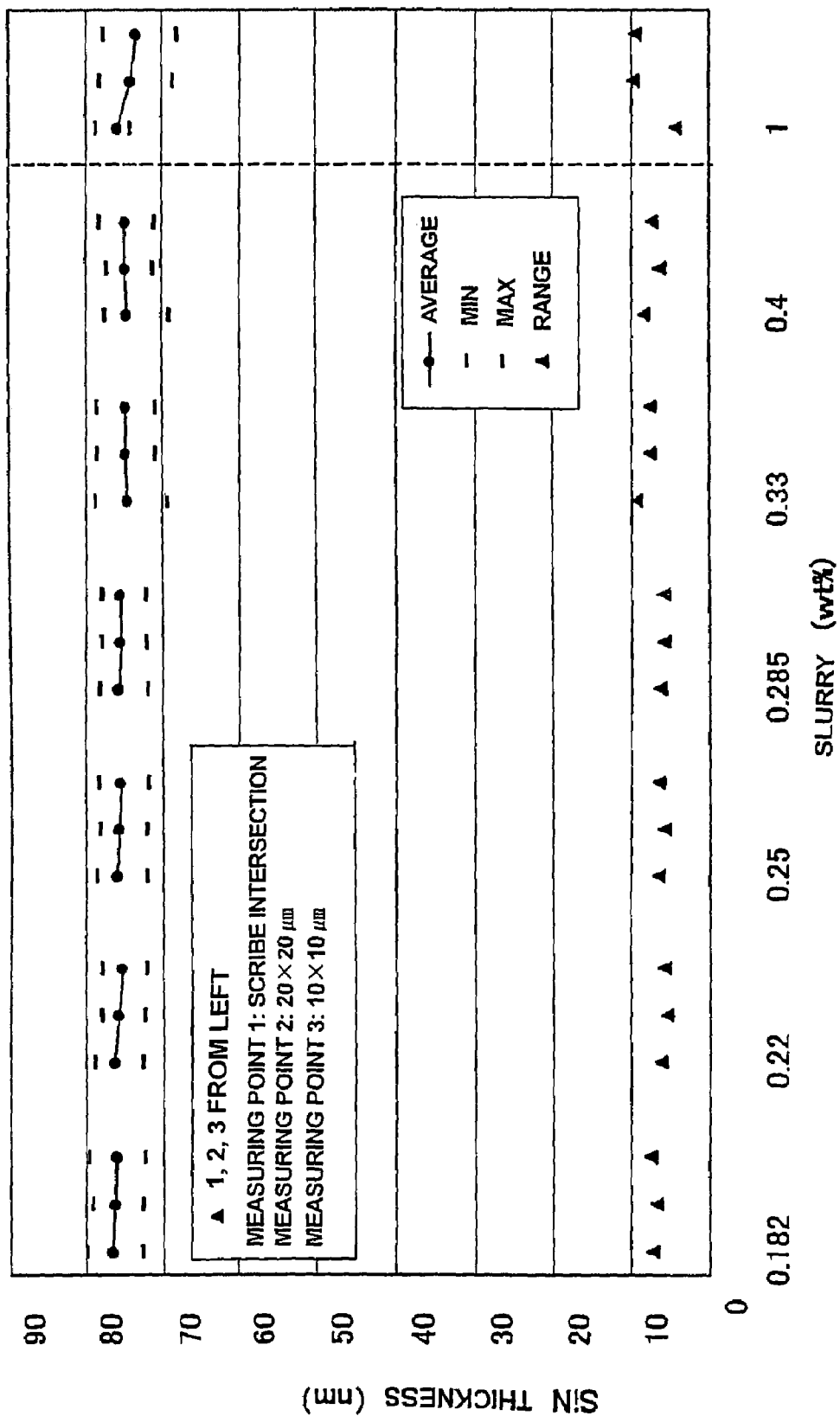
FIG. 5 is a plot graph showing level gaps among patterns with respect to slurry concentrations, according to the example.

FIG. 5 is a plot graph showing an investigation result of level gaps among patterns with respect to slurry concentrations. FIG. 5 reflects solely the level gaps among patterns observed when the second CMP process was performed utilizing the second ceria slurries of a different slurry concentration. The horizontal axis of the graph represents slurry concentrations of the second ceria slurries, and the vertical axis represents thicknesses of the silicon nitride films. The graph shows an average value of three measuring points with respect to each specimen.

In view of the result shown in FIG. 5, it is preferable to set the slurry concentration of the second ceria slurry to be 40% or lower than that of the first ceria slurry, in this embodiment. For example, the slurry concentration of the first ceria slurry is set to be 1 wt % and the slurry concentration of the second ceria slurry is set to be 0.18 to 0.4 wt %, both inclusive. Such arrangement more assuredly suppresses a variation in thickness among patterns of the silicon nitride film, during the second CMP process.

Figure 6:
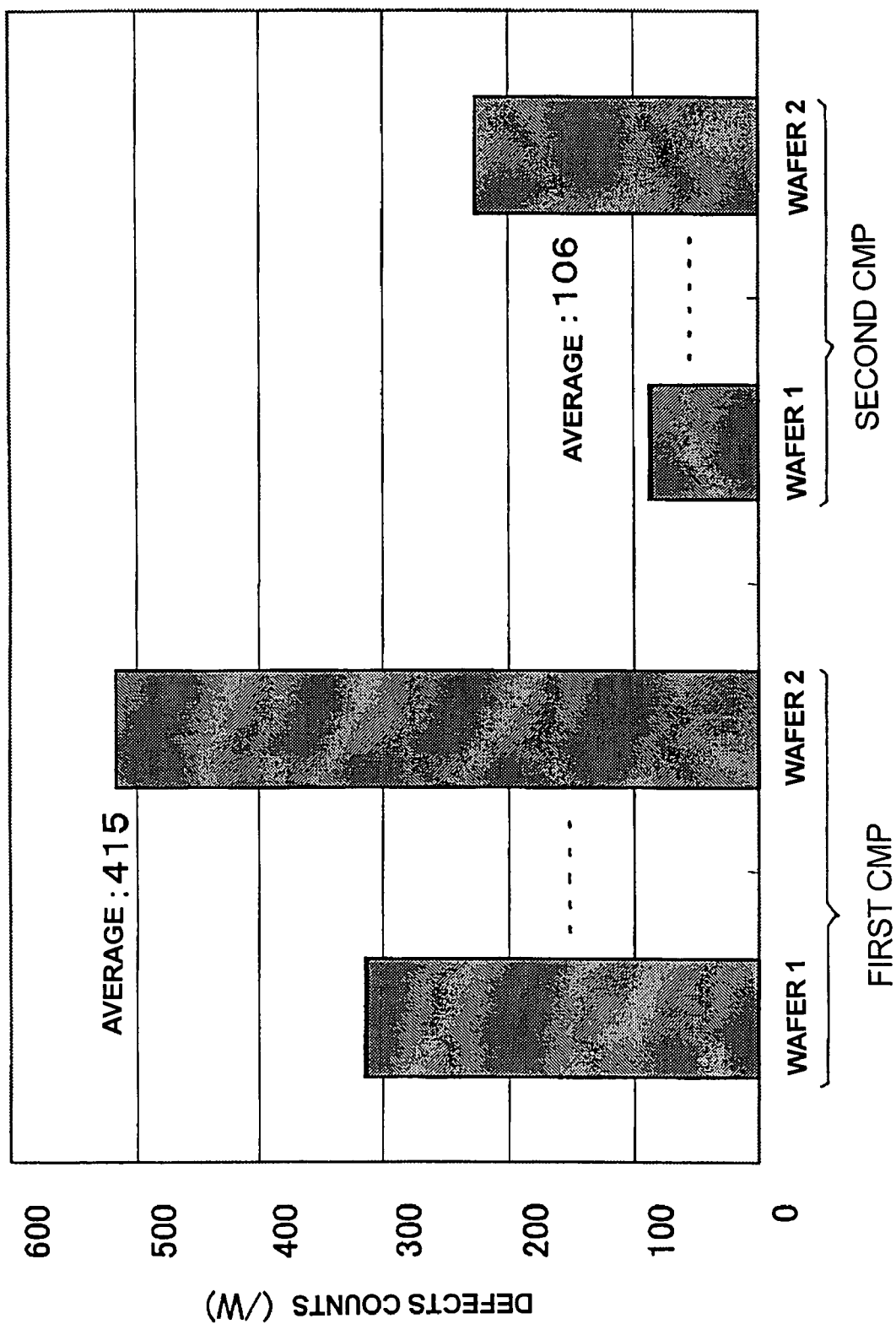
FIG. 6 is a bar graph for comparing the number of scratches between the first and the second CMP process according to the example.

FIG. 6 is a comparison bar graph showing the number of scratches formed when polished by the first ceria slurry during the first CMP process only, and the number of scratches formed when polished by the second ceria slurry during the second CMP process, after the first CMP process.

The measurement was performed with respect to a plurality of wafers, the number of scratches formed during the first CMP process has proved to be little more than 300 on a smallest wafer 1, and little more than 500 on a largest wafer 2, with an average value of 415.

Upon performing the second CMP process, the number of scratches has proved to be slightly fewer than 100 on a smallest wafer 1, and little more than 200 on a largest wafer 2, with an average value of 106.

In view of the foregoing result, it has been proven that performing the first and the second CMP process allows reducing the number of scratches by approximately 60%, compared with a case of only performing the first CMP process.

Figure 7:
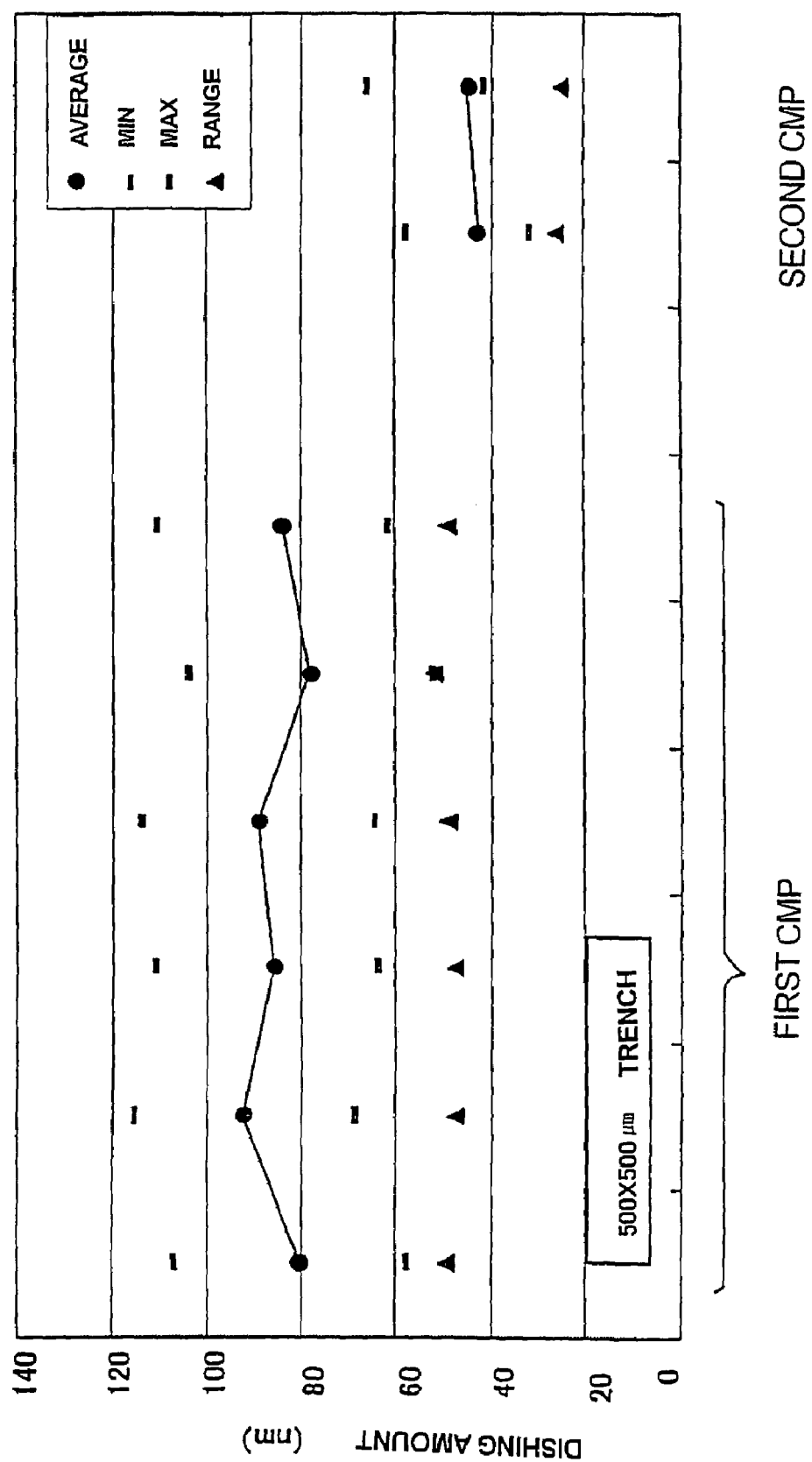
FIG. 7 is a plot graph for comparing a dishing amount between the first and the second CMP process according to the example.
Figure 9A:
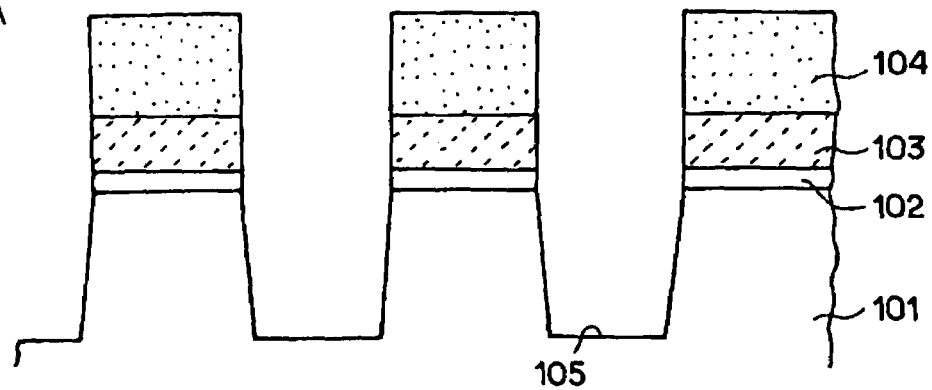
FIG. 9A is a schematic cross-sectional view showing a formation process of an STI by a conventional CMP process.
Figure 9B:
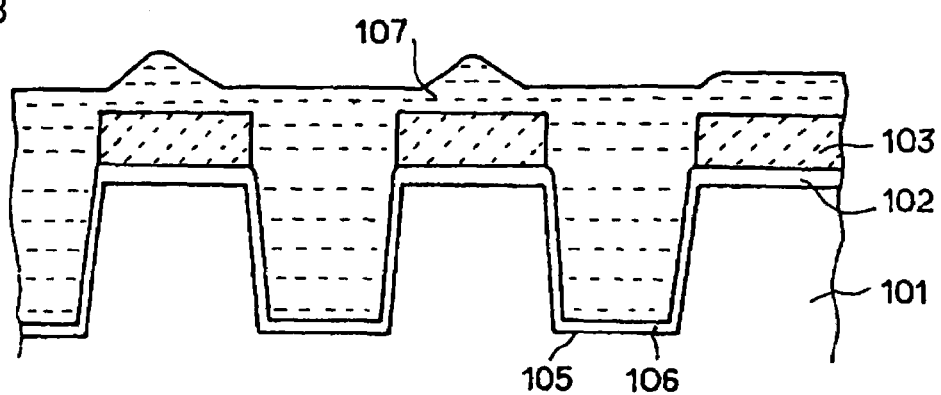
FIG. 9B is a schematic cross-sectional view showing a formation process of an STI by a conventional CMP process.
Figure 9C:
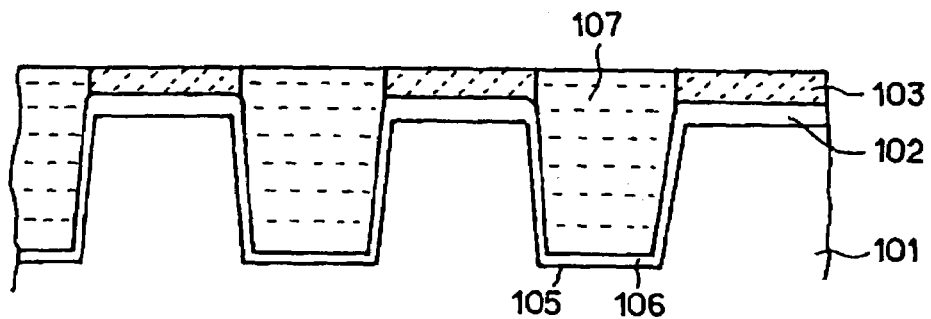
FIG. 9C is a schematic cross-sectional view showing a formation process of an STI by a conventional CMP process.
Figure 9D:
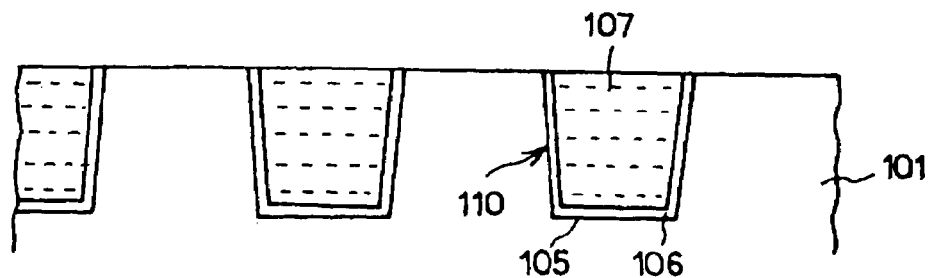
FIG. 9D is a schematic cross-sectional view showing a formation process of an STI by a conventional CMP process.

FIG. 7 is a plot graph for comparing amounts of dishing caused when polished by the first ceria slurry during the first CMP process only, and amounts of dishing caused when polished by the second ceria slurry during the second CMP process, after the first CMP process. It is understood that the dishing amounts are approximately 90 nm when only the first CMP process has been performed, while the dishing amounts have been diminished to approximately 40 nm, as a result of performing both of the first and the second CMP process.

FIG. 8 is a cross-reference table showing an evaluation result of numbers of scratches and dishing amounts, after the second CMP process in which the second ceria slurries of different slurry concentrations and additive concentrations have been employed.

Here, the first ceria slurry was prepared at a mixing ratio (ceria-containing liquid/additive-containing liquid/water) of (1/1/0), in other words a ceria-containing liquid containing a 2 wt % of ceria and an additive-containing liquid containing a 2 wt % of additive were mixed at a ratio of 1:1, without adding any water. Accordingly, the concentration of the ceria and the additive in the first ceria slurry respectively became a half of the initial concentration, which is 1 wt %.

FIG. 8 shows the cases where mixing ratios of the additive-containing liquid were varied as 2, 3, 4, and those of water were varied as 2, 3, 4, 5, 6, for preparing the second ceria slurry A to G on the basis of the first ceria slurry. For example, the second ceria slurry A is a mixture of one volume of ceria-containing liquid containing a 2 wt % of ceria, two volumes of additive-containing liquid containing a 2 wt % of additive and two volumes of pure water. Accordingly the ceria-containing liquid occupies one fifth of the total slurry volume, and hence the ceria concentration becomes one fifth of the initial 2 wt %, which is 0.4 wt %. Likewise, the additive-containing liquid occupies two fifths of the total slurry volume, and the additive concentration becomes two fifths of the initial 2 wt %, which is 0.8 wt %.

In this way, while the slurry concentrations of the second ceria slurries A to G ranges from 0.4 to 0.182 wt %, the additive concentrations remains in a range of 1 to 0.72 wt %, by adjusting a ratio of the water and the additive.

In view of FIG. 8 showing the level gaps among patterns, the numbers of scratches and the dishings after having performed the first CMP process utilizing the first ceria slurry and the second CMP process utilizing the second ceria slurries A to G, it is apparent that lower values have been achieved than those of the case where only the first CMP process was performed, by performing the second CMP process under all the different concentrations, and, hence, that those characteristics have been improved.

Meanwhile, regarding the columns corresponding to the first ceria slurry, the values represent the level gap among patterns, the number of scratches and the dishing after performing only the first CMP process in a conventional method, without utilizing the second ceria slurry.

It is understood that among these cases, the second ceria slurry prepared in a mixing ratio of (1/4/4) has achieved a most significant improvement in the number of scratches and the dishing amount. Based on such outcome, it is preferable to set the slurry concentration of the second ceria slurry as described earlier, and to set the additive concentration of the second ceria slurry to be substantially the same as the additive concentration of the first ceria slurry, and more specifically not less than 70%. Meanwhile, values corresponding to blank columns in FIG. 8 have not been measured.

Although the example of the present invention has been described in details referring to the drawings, it is to be understood that the foregoing description is only exemplary, and that various other constitutions may be adopted.

For example, in the foregoing example, the additive is not limited to the polycarboxylic acid polymer, as long as the additive can serve as a surfactant.

Also, the second ceria slurry does not always need to have a same slurry concentration, and a same additive concentration, but the second CMP process may be further divided into a plurality of substages, to thereby perform the second CMP process gradually or continuously varying the concentration values. Such arrangement allows reducing the slurry concentration to a minimal level at a final stage of the second CMP process so as to more strictly inhibiting formation of scratches or occurrence of a dishing, while preventing a polishing time through an overall CMP process from being prolonged by a drop of the polishing rate of the second film caused by a decrease in slurry concentration.

It is apparent that the present invention is not limited to the above embodiment, that may be modified and changed without departing from the scope and spirit of the invention.

What is claimed is:

1. A method of manufacturing a semiconductor device comprising:

forming a first film at least on a part of a semiconductor substrate;

forming a second film all over said semiconductor substrate including said first film; and performing a CMP process employing a ceria slurry for planarizing said second film utilizing said first film as a stopper film;

wherein said performing said CMP process includes performing a first CMP process until a portion of said first film is exposed and performing a second CMP process thereafter;

said first CMP process includes utilizing a first ceria slurry of a predetermined abrasive grain concentration; and said second CMP process includes utilizing a second ceria slurry having a lower abrasive grain concentration than that of said first ceria slurry, wherein said ceria slurry contains an additive constituted of a surfactant, and a concentration of said additive is set to be substantially the same between said first ceria slurry and said second ceria slurry.

2. The method according to claim 1, wherein said abrasive grain concentration of said second ceria slurry is set to be 40% or lower, with respect to said abrasive grain concentration of said first ceria slurry.

3. The method according to claim 1, wherein said additive concentration of said second ceria slurry is set to be approximately 70% or higher, with respect to said additive concentration of said first ceria slurry.

4. The method according to claim 1, wherein said performing a CMP process includes preparing in advance said first and said second ceria slurry of a different abrasive grain concentration, and replacing said first ceria slurry with said second ceria slurry at a transition from said first CMP process to said second CMP process.

5. The method according to claim 1, wherein said second CMP process includes adding a dispersion medium (solvent) to said first ceria slurry used in said first CMP process, and utilizing said first ceria slurry of a lowered abrasive grain concentration as said second ceria slurry.

6. The method according to claim 1, wherein said performing said second CMP process includes setting a polishing rate ratio between said second film and said first film (a polishing rate of said second film/a polishing rate of said first film) to be smaller by an order of magnitude than a polishing rate ratio in said first CMP process.

7. The method according to claim 1, wherein said first film is a silicon nitride film, and said second film is a silicon dioxide film.

8. The method according to claim 7, wherein said forming said second film includes forming said silicon dioxide film by a high-density plasma CVD process.

9. A method of manufacturing a semiconductor device comprising:
    forming a first film at least on a part of a semiconductor substrate;
    forming a second film all over said semiconductor substrate including said first film; and
    performing a CMP process employing a ceria slurry for planarizing said second film utilizing said first film as a stopper film;
    wherein said performing said CMP process includes performing a first CMP process until a portion of said first film is exposed and performing a second CMP process thereafter;
    said first CMP process includes utilizing a first ceria slurry of a predetermined abrasive grain concentration; and
    said second CMP process includes utilizing a second ceria slurry having a lower abrasive grain concentration than that of said first ceria slurry, said second CMP process including adding a dispersion medium (solvent) to said first ceria slurry used in said first CMP process, and utilizing said first ceria slurry of a lowered abrasive grain concentration as said second ceria slurry and introducing an additive to said solvent to be added to said first ceria slurry, so as to utilize said first ceria slurry as said second ceria slurry.

10. A method of manufacturing a semiconductor device, comprising:
    stacking a first silicon dioxide film and a silicon nitride film in this sequence on a semiconductor substrate;
    forming a mask with an opening of a predetermined shape on said silicon nitride film;
    selectively removing by etching said silicon nitride film, said first silicon dioxide film and said semiconductor substrate sequentially, so as to form a trench on said semiconductor substrate;
    growing a second silicon dioxide film so as to fill said trench and said first silicon dioxide film and said silicon nitride film; and
    performing a CMP process for planarizing a surface of said second silicon dioxide film;
    wherein said performing said CMP process includes performing a first CMP process utilizing a first ceria slurry of a predetermined abrasive grain concentration and a second CMP process utilizing a second ceria slurry having a lower abrasive grain concentration than that of the first ceria slurry, each of the first and second ceria slurries including an additive constituted of a surfactant, and a concentration of said additive is set to be substantially the same between the first and second ceria slurries.

11. The method according to claim 10, further comprising, after said performing said second CMP process, removing said silicon nitride film and planarizing by wet etching said first and second silicon dioxide film remained over semiconductor substrate.

* * * * *